(12) United States Patent
Gaska et al.

(10) Patent No.: US 7,619,238 B2
(45) Date of Patent: Nov. 17, 2009

(54) HETEROSTRUCTURE INCLUDING LIGHT GENERATING STRUCTURE CONTAINED IN POTENTIAL WELL

(75) Inventors: Remigijus Gaska, Columbia, SC (US); Michael Shur, Latham, NY (US); Jianping Zhang, Lexington, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 380 days.

(21) Appl. No.: 11/539,754

(22) Filed: Oct. 9, 2006

(65) Prior Publication Data

US 2007/0181869 A1 Aug. 9, 2007

Related U.S. Application Data

(60) Provisional application No. 60/765,270, filed on Feb. 4, 2006.

(51) Int. Cl.
*H01L 31/00* (2006.01)
(52) U.S. Cl. ............................. 257/14; 257/22; 257/23; 257/E29.069; 372/43.01; 438/29
(58) Field of Classification Search ............. 257/13–25; 372/39, 43.01, 44.01, 45.01, 5.11, 45.011; 438/29
See application file for complete search history.

(56) References Cited

U.S. PATENT DOCUMENTS

| | | | | |
|---|---|---|---|---|
| 5,012,302 A | * | 4/1991 | Goronkin | 257/15 |
| 5,592,501 A | * | 1/1997 | Edmond et al. | 372/45.011 |
| 5,727,010 A | * | 3/1998 | Capasso et al. | 372/50.11 |
| 5,877,509 A | * | 3/1999 | Pau et al. | 257/14 |
| 5,917,195 A | | 6/1999 | Brown | |

OTHER PUBLICATIONS

Olesberg et al., "Mid-infrared InAs/GaInSb separate confinement heterostructure laser diode structures," Mar. 15, 2001, pp. 3283-3289, Journal of Applied Physics, vol. 89 No. 6.

Paulavicius et al., "Hot-optical-phonon effects on electron relaxation in an AlGaAs/GaAs quantum cascade laser structure," Oct. 1, 1998, pp. 3459-3466, Journal of Applied Physics, vol. 84 No. 7.

(Continued)

*Primary Examiner*—Evan Pert
*Assistant Examiner*—Scott R Wilson
(74) *Attorney, Agent, or Firm*—John W. LaBatt; Hoffman Warnick LLC

(57) ABSTRACT

A light emitting heterostructure and/or device in which the light generating structure is contained within a potential well is provided. The potential well is configured to contain electrons, holes, and/or electron and hole pairs within the light generating structure. A phonon engineering approach can be used in which a band structure of the potential well and/or light generating structure is designed to facilitate the emission of polar optical phonons by electrons entering the light generating structure. To this extent, a difference between an energy at a top of the potential well and an energy of a quantum well in the light generating structure can be resonant with an energy of a polar optical phonon in the light generating structure material. The energy of the quantum well can comprise an energy at the top of the quantum well, an electron ground state energy, and/or the like.

29 Claims, 9 Drawing Sheets

OTHER PUBLICATIONS

PCT International Search Report and Written Opinion of the ISA, Apr. 30, 2008.

Saxler, A. et al., "Aluminum gallium nitride short-period superlattices doped with magnesium," Applied Physics Letters, vol. 74, No. 14, Apr. 5, 1999, pp. 2023-2025.

Peng, H. et al., "Ultraviolet light-emitting diodes operating in the 340 nm wavelength range and application to time-resolved fluorescence spectroscopy," Applied Physics Letters, vol. 85, No. 8, Aug. 23, 2004, pp. 1436-1438.

Goepfert, I.D. et al., "Experimental and theoretical study of acceptor activation and transport properties in p-type $Al_xGa_{1-x}N/GaN$ superlattices," Journal of Applied Physics, vol. 88, No. 4, Aug. 15, 2000, pp. 2030-2038.

Wang, T. et al., "1 mW AllnGaN-based ultraviolet light-emitting diode with an emission wavelength of 348 nm grown on sapphire substrate," Applied Physics Letters, vol. 81, No. 14, Sep. 30, 2002, pp. 2508-2510.

Nishida, Toshio et al., "Efficient and high-power AlGaN-based ultraviolet light-emitting diode grown on bulk GaN," Applied Physics Letters, vol. 79, No. 6, Aug. 6, 2001, pp. 711-712.

Kozodoy, Peter et al., "Polarization-enhanced Mg doping of AlGaN/GaN superlattices," Applied Physics Letters, vol. 75, No. 16, Oct. 18, 1999, pp. 2444-2446.

Shur, M.S. et al., "Accumulation hole layer in p-GaN/AlGaN heterostructures," Applied Physics Letters, vol. 76, No. 21, May 22, 2000, pp. 3061-3063.

Zhang, J.P. et al., "Milliwatt power deep ultraviolet light-emitting diodes over sapphire with emission at 278 nm," Applied Physics Letters, vol. 81, No. 26, Dec. 23, 2002, pp. 4910-4912.

Zhang, J.P. et al., "AlGaN multiple-quantum-well-based, deep ultraviolet light-emitting diodes with significantly reduced long-wave emission," Applied Physics Letters, vol. 83, No. 17, Oct. 27, 2003, pp. 3456-3458.

Chitnis, A. et al., "Improved performance of 325-nm emission AlGaN ultraviolet light-emitting diodes," Applied Physics Letters, vol. 82, No. 16, Apr. 21, 2003, pp. 2565-2567.

Sun, W.H. et al., "AlGaN-based 280 nm light-emitting diodes with continuous wave powers in excess of 1.5 mW," Applied Physics Letters, vol. 85, No. 4, Jul. 26, 2004, pp. 531-533.

Adivarahan, V. et al., "High-efficiency 269 nm emission deep ultraviolet light-emitting diodes," Applied Physics Letters, vol. 84, No. 23, Jun. 7, 2004, pp. 4762-4764.

Yasan, A. et al., "4.5 mW operation of AlGaN-based 267 nm deep-ultraviolet light-emitting diodes," Applied Physics Letters, vol. 83, No. 23, Dec. 8, 2003, pp. 4701-4703.

Fischer, A.J. et al., "Room-temperature direct current operation of 290 nm light-emitting diodes with milliwatt power levels," Applied Physics Letters, vol. 84, No. 17, Apr. 26, 2004, pp. 3394-3396.

Tamulaitis, G. et al., "Dislocation-limited Lifetime of Nonequilibrium Carriers in AlGaN Epilayers," Proceedings of ICPS-27 (2004), pp. 1-2 in copy provided.

Kamiyama, S. et al., "Heteroepitaxial technology for high-efficiency UV light-emitting diode," Opto-Electronics Review, 10, No. 4, 2002, pp. 225-230.

Zhang, J.P. et al., "AlGaN Based 280 nm Light Emitting Diodes with Continuous-Wave Power Exceeding 1 mW at 25 mA," Applied Physics Letters, vol. 85, No. 23, Dec. 2004, p. 5532 (pp. 1-11 in copy provided).

\* cited by examiner

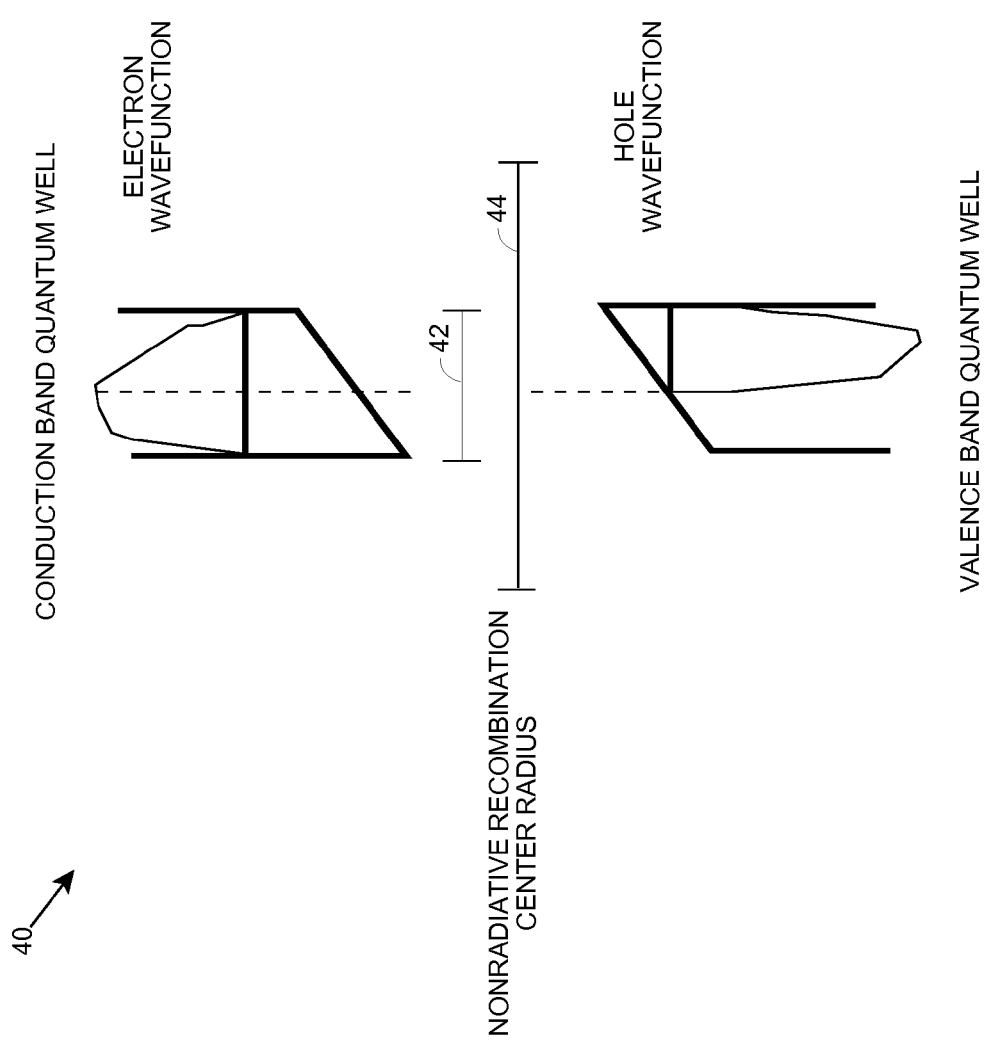

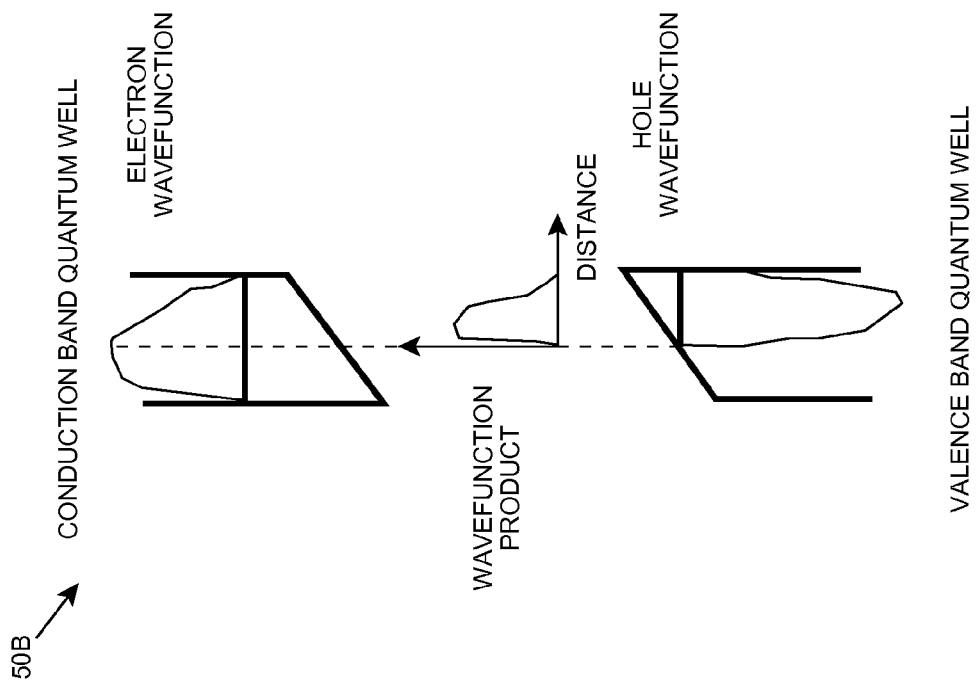
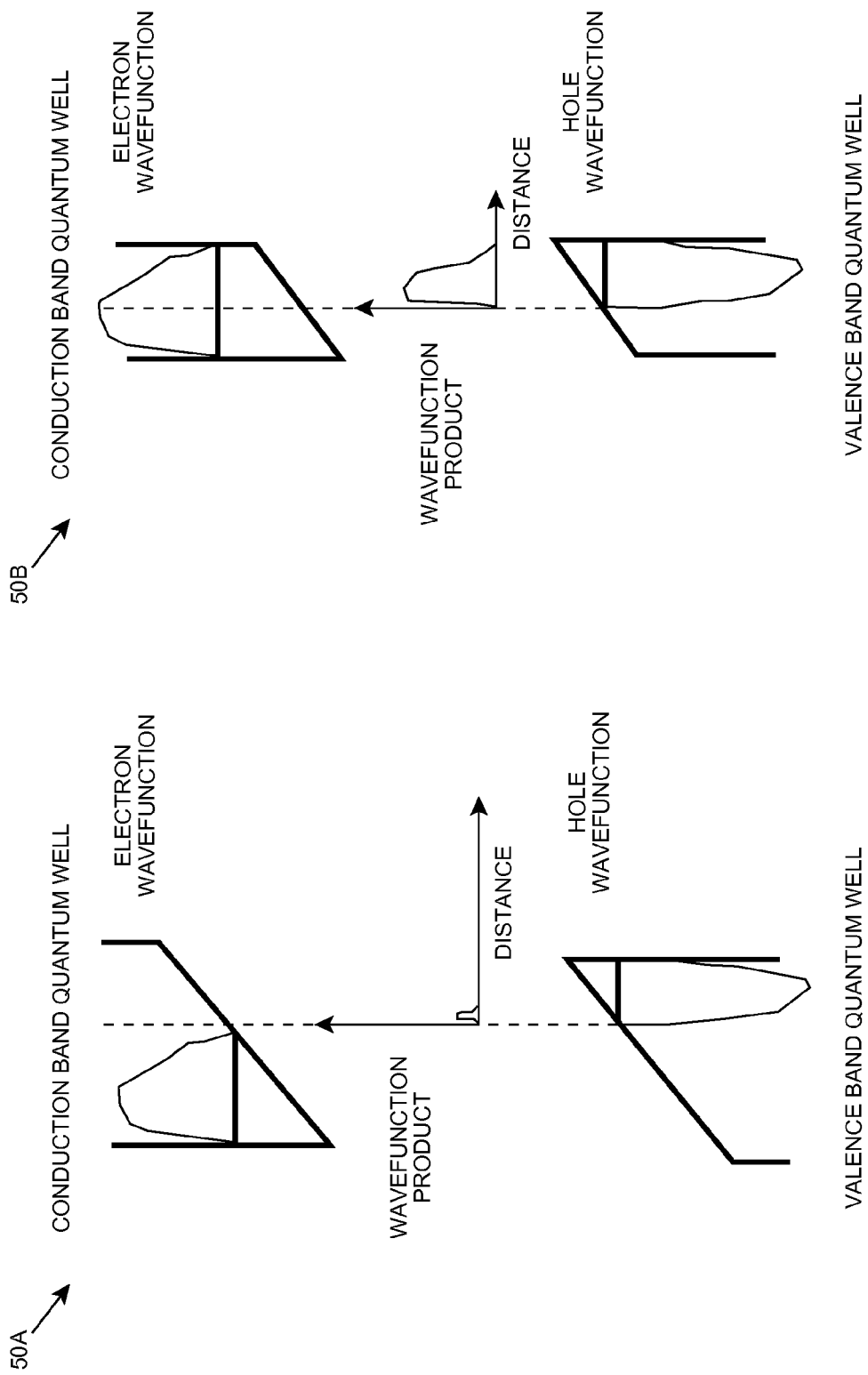

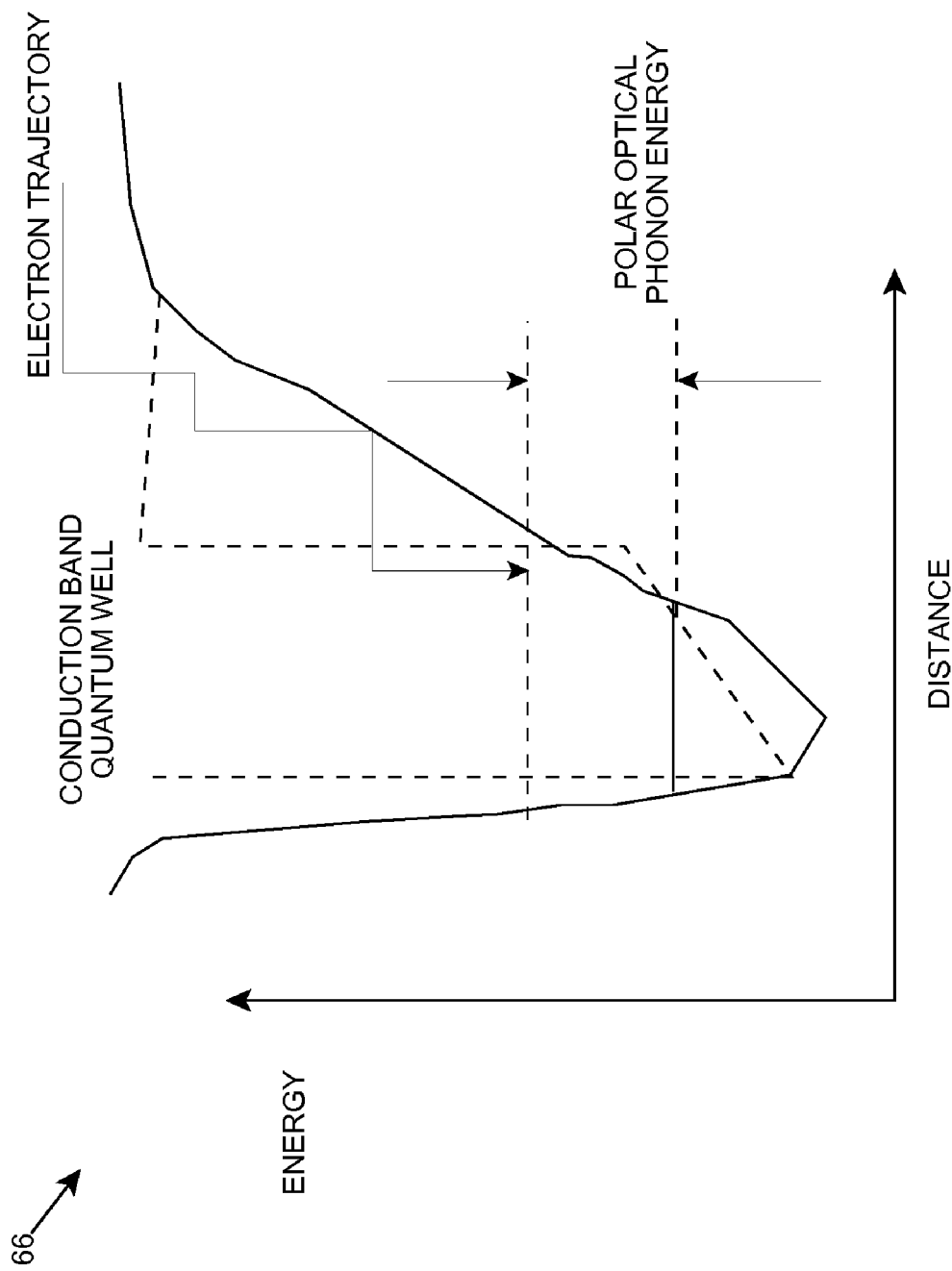

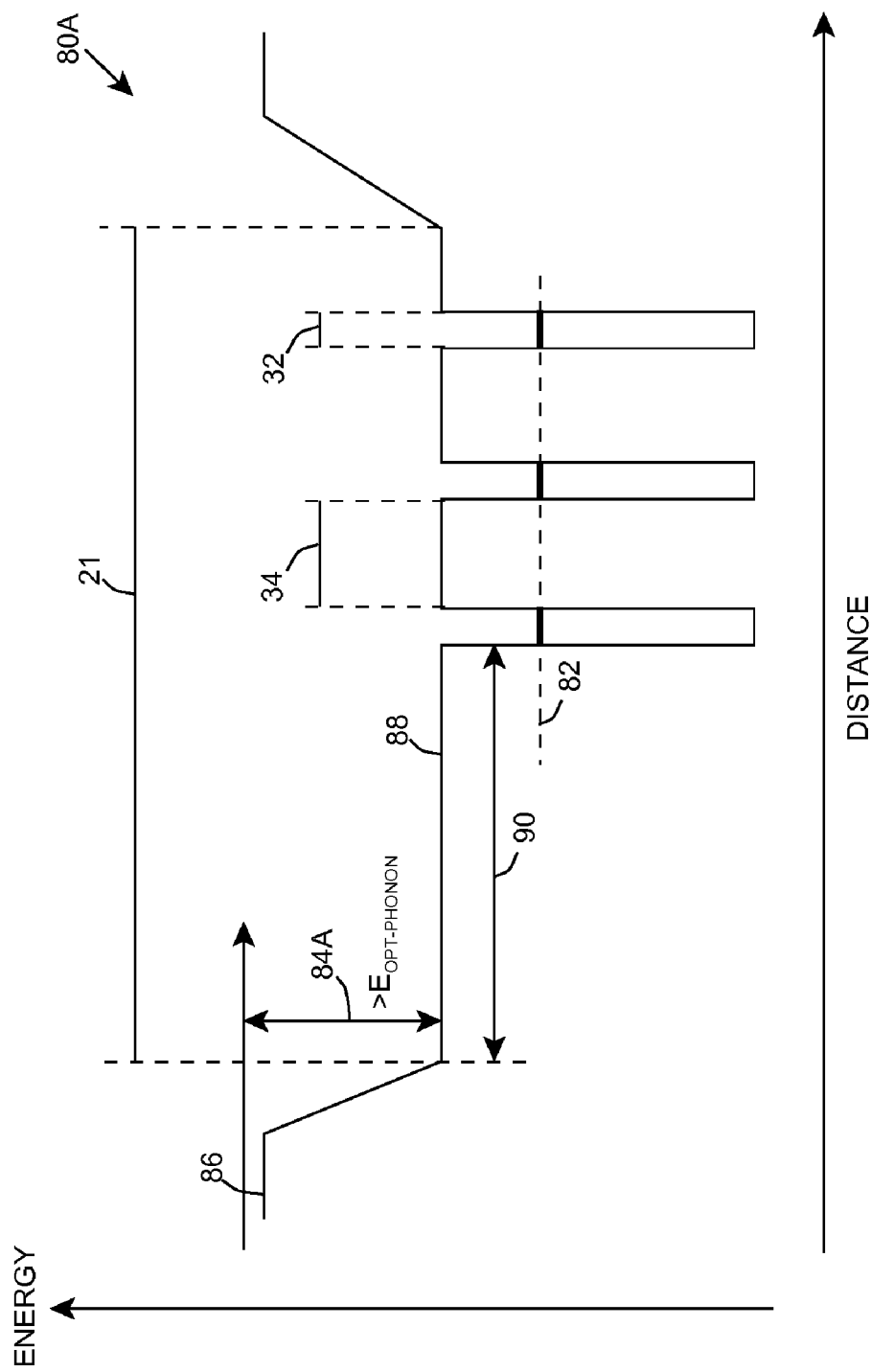

US 7,619,238 B2

HETEROSTRUCTURE INCLUDING LIGHT GENERATING STRUCTURE CONTAINED IN POTENTIAL WELL

REFERENCE TO PRIOR APPLICATIONS

The current application claims the benefit of co-pending U.S. Provisional Application No. 60/765,270, entitled "Light Emitting Heterostructure", which was filed on 4 Feb. 2006, which is hereby incorporated herein by reference. Aspects of the current application also are related to the co-owned, co-pending U.S. patent application Ser. No. 11/292,519, entitled "Nitride-Based Light Emitting Heterostructure", which was filed on 2 Dec. 2005, and which also is hereby incorporated herein by reference.

FIELD OF THE INVENTION

The invention relates generally to heterostructures, and more particularly, to an improved light emitting heterostructure.

BACKGROUND OF THE INVENTION

Recently, a great deal of interest is focused on nitride-based light emitting diodes and lasers that emit light in the blue and deep ultraviolet (UV) wavelengths. These devices may be capable of being incorporated into various applications, including solid-state lighting, biochemical detection, high-density data storage, and the like. However, to date, the performance of nitride-based light emitting diodes and lasers quickly worsens as the radiation wavelength is reduced into the ultraviolet range.

A modern light emitting diode (LED) consists of three major components: an electron supply layer (e.g., an n-type semiconductor) and a hole supply layer (e.g., a p-type semiconductor), with a light generating structure between them. The relatively poor efficiency with which light is generated by the light generating structure is a significant barrier to improving the performance of the device in generating light having the shorter wavelengths. Such efficiency is limited by a large difference between the mobilities of electrons and holes. Since electrons are more mobile than holes, the electrons travel more quickly than holes.

To address this situation, some approaches incorporate an electron blocking layer between the light generating structure and a p-type contact layer. The electron blocking layer slows down electrons and allows for a more efficient radiative recombination. However, the electron blocking layer also increases the series resistance of the device and, to a certain extent, provides a barrier for holes as well. Many approaches incorporate multiple quantum wells into the light generating structure to increase the concentration of electron-hole pairs. However, these approaches still fail to provide a solution that efficiently generates light in the shorter wavelengths. Since an amount of nonradiative recombination of electrons and holes is determined by dislocations, many approaches seek to improve the quality of the materials used in the device. Nevertheless, the efficiency of deep UV LEDs remains low.

Another difficulty in developing a UV LED is a deficient hole injection. To date, Magnesium (Mg) is the most successful acceptor, and is therefore commonly used for p-type Gallium (Ga) Nitride (N) layers. The room-temperature activation energy for such a layer can be as high as two-hundred fifty milli-electron Volts (meV), and increases roughly linearly with the Aluminum (Al) molar fraction in AlGaN alloys. However, a large acceptor activation energy results in a deficient hole injection. This is particularly true for a deeper UV LED, in which a higher Al molar fraction is required.

Various approaches seek to enhance the conductivity for a p-type Mg-doped AlGaN layer. In one approach, a Mg-doped AlGaN/GaN short period superlattice (SPSL), such as a Mg-doped AlGaN/GaN SPSL in 340-350 nm UV LED growth, in place of the layer. In this case, a period of the superlattice is sufficiently small (e.g., below four nanometers) so that the effect of the polarization fields on the minibands in the SPSL is negligible. As a result, a vertical conduction of the p-type SPSL is not degraded by the polarization fields.

Another approach uses a Mg-doped AlGaN/GaN large period superlattice (LPSL). In this case, with a period larger than fifteen nm, a valence band discontinuity and the polarization fields can enhance the ionization of the acceptors in the AlGaN barriers and transfer holes into GaN wells. However, the large period inhibits the wavefunction coupling between neighboring wells, which greatly reduces the vertical conductivity. As a result, this LPSL approach can only enhance lateral horizontal p-conductivity. To date, no known approach has successfully used a p-type LPSL for a deep UV LED.

Yet another approach uses a p-GaN/p-AlGaN single heterostructure to accumulate holes at the interface. The mechanism of this approach is similar to the LPSL approach. However, since the p-GaN/p-AlGaN single heterostructure only includes one barrier for hole transportation, the vertical conductivity can be greatly enhanced due to the high-density hole accumulation at the interface and the field assisted tunneling as well as thermal emission. Several UV LEDs have been proposed that incorporate this approach, and have achieved reasonably good output powers. However, it remains desirable to improve the output power and/or efficiency of UV LEDs.

In view of the foregoing, there exists a need in the art to overcome one or more of the deficiencies indicated herein.

BRIEF SUMMARY OF THE INVENTION

The invention provides an improved nitride-based light emitting heterostructure. The nitride-based light emitting heterostructure includes an electron supply layer and a hole supply layer with a light generating structure disposed therebetween. The light generating structure includes a set of barrier layers, each of which has a graded composition, and a set of quantum wells, each of which adjoins at least one barrier layer. Additional features, such as a thickness of each quantum well, can be selected/incorporated into the heterostructure to improve one or more of its characteristics. Further, one or more additional layers that include a graded composition can be included in the heterostructure outside of the light generating structure. The graded composition layer(s) cause electrons to lose energy prior to entering a quantum well in the light generating structure, which enables the electrons to recombine with holes more efficiently in the quantum well.

A first aspect of the invention provides a nitride-based light emitting heterostructure comprising: an electron supply layer; a hole supply layer; and a light generating structure disposed between the electron supply layer and the hole supply layer, the light generating structure including: a set of barrier layers, each barrier layer comprising a graded composition; and a set of quantum wells, each quantum well adjoined by a barrier layer and having a thickness less than a characteristic radius of at least one defect responsible for nonradiative recombination.

A second aspect of the invention provides a nitride-based light emitting device comprising: a substrate; a buffer layer on the substrate; a strain-relieving structure over the buffer layer; an electron supply layer over the strain-relieving structure; a hole supply layer; and a light generating structure disposed between the electron supply layer and the hole supply layer, the light generating structure including: a set of barrier layers, each barrier layer comprising a graded composition; and a set of quantum wells, each quantum well adjoined by a barrier layer and having a thickness less than a characteristic radius of at least one defect responsible for nonradiative recombination.

A third aspect of the invention provides a method of generating a nitride-based light emitting heterostructure, the method comprising: obtaining a substrate; forming an electron supply layer over the substrate; forming a light generating structure over the electron supply layer, the forming a light generating structure including: forming a set of barrier layers, each barrier layer comprising a graded composition; and forming a set of quantum wells, each quantum well adjoined by a barrier layer and having a thickness less than a characteristic radius of at least one defect responsible for nonradiative recombination; and forming a hole supply layer over the light generating structure.

A fourth aspect of the invention provides a method of generating a nitride-based light emitting device, the method comprising: obtaining a substrate; forming an electron supply layer over the substrate; forming a light generating structure over the electron supply layer, the forming a light generating structure including: forming a set of barrier layers, each barrier layer comprising a graded composition; and forming a set of quantum wells, each quantum well adjoined by a barrier layer and having a thickness less than a characteristic radius of at least one defect responsible for nonradiative recombination; and forming a hole supply layer over the light generating structure.

Additional aspects of the invention provide a light emitting heterostructure and/or device in which the light generating structure is contained within a potential well. The potential well is configured to contain electrons, holes, and/or electron and hole pairs within the light generating structure. A phonon engineering approach can be used in which a band structure of the potential well and/or light generating structure is designed to facilitate the emission of polar optical phonons by electrons entering the light generating structure. To this extent, a difference between an energy at a top of the potential well and an energy of a quantum well in the light generating structure can be resonant with an energy of a polar optical phonon in the light generating structure material. The energy of the quantum well can comprise an energy at the top of the quantum well, an electron ground state energy, and/or the like.

A fifth aspect of the invention provides a light emitting heterostructure comprising: a light generating structure contained within a potential well, the light generating structure including a set of quantum wells, wherein a difference between a first energy at a top of the potential well and a second energy of a quantum well in the set of quantum wells is resonant with an energy of a polar optical phonon in a material of the light generating structure.

A sixth aspect of the invention provides a light emitting device comprising: a substrate; an electron supply layer over the substrate; and a light generating structure that receives electrons from the electron supply layer and is contained within a potential well, the light generating structure including: a set of quantum wells, wherein a difference between a first energy at a top of the potential well and a second energy of a quantum well in the set of quantum wells is resonant with an energy of a polar optical phonon in a material of the light generating structure.

A seventh aspect of the invention provides a method of generating a light emitting heterostructure, the method comprising: forming a region of the light emitting heterostructure having a potential well; and forming a light generating structure within the potential well, the forming the light generating structure including: forming a set of quantum wells, wherein a difference between a first energy at a top of the potential well and a second energy of a quantum well in the set of quantum wells is resonant with an energy of a polar optical phonon in a material of the light generating structure.

An eighth aspect of the invention provides a method of generating a light emitting heterostructure, the method comprising: forming a substrate; forming an electron supply layer over the substrate; and forming a light generating structure that receives electrons from the electron supply layer and is contained within a potential well, the forming the light generating structure including: forming a set of quantum wells, wherein a difference between a first energy at a top of the potential well and a second energy of a quantum well in the set of quantum wells is resonant with an energy of a polar optical phonon in a material of the light generating structure.

The illustrative aspects of the present invention are designed to solve the problems herein described and other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention, in which:

FIG. 4 shows a band diagram of an illustrative quantum well according to an embodiment of the invention.

FIGS. 5A-B show illustrative band diagrams of a relatively thick quantum well and a relatively thin quantum well, respectively.

FIG. 8 shows a quantum well having an adjacent electron supply barrier layer according to an embodiment of the invention.

FIGS. 9A-E show illustrative schematic band structure profiles for a potential well containing a light emitting quantum well structure according to embodiments of the invention.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

It is understood that for the purposes of the present disclosure, Al means Aluminum, Be means Beryllium, C means Carbon, Ga means Gallium, In means Indium, Li means Lithium, Mg means Magnesium, Mn means Manganese, N means Nitrogen, O means Oxygen, and Si means Silicon.

As indicated above, the invention provides an improved nitride-based light emitting heterostructure. The nitride-based light emitting heterostructure includes an electron supply layer and a hole supply layer with a light generating structure disposed there between. The light generating structure includes a set of barrier layers, each of which has a graded composition, and a set of quantum wells, each of which adjoins at least one barrier layer. Additional features, such as a thickness of each quantum well, can be selected/incorporated into the heterostructure to improve one or more of its characteristics. Further, one or more additional layers that include a graded composition can be included in the heterostructure outside of the light generating structure. The graded composition layer(s) cause electrons to lose energy prior to entering a quantum well in the light generating structure, which enables the electrons to recombine with holes more efficiently in the quantum well. As used herein, unless otherwise noted, the term "set" means one or more.

Figure 1:
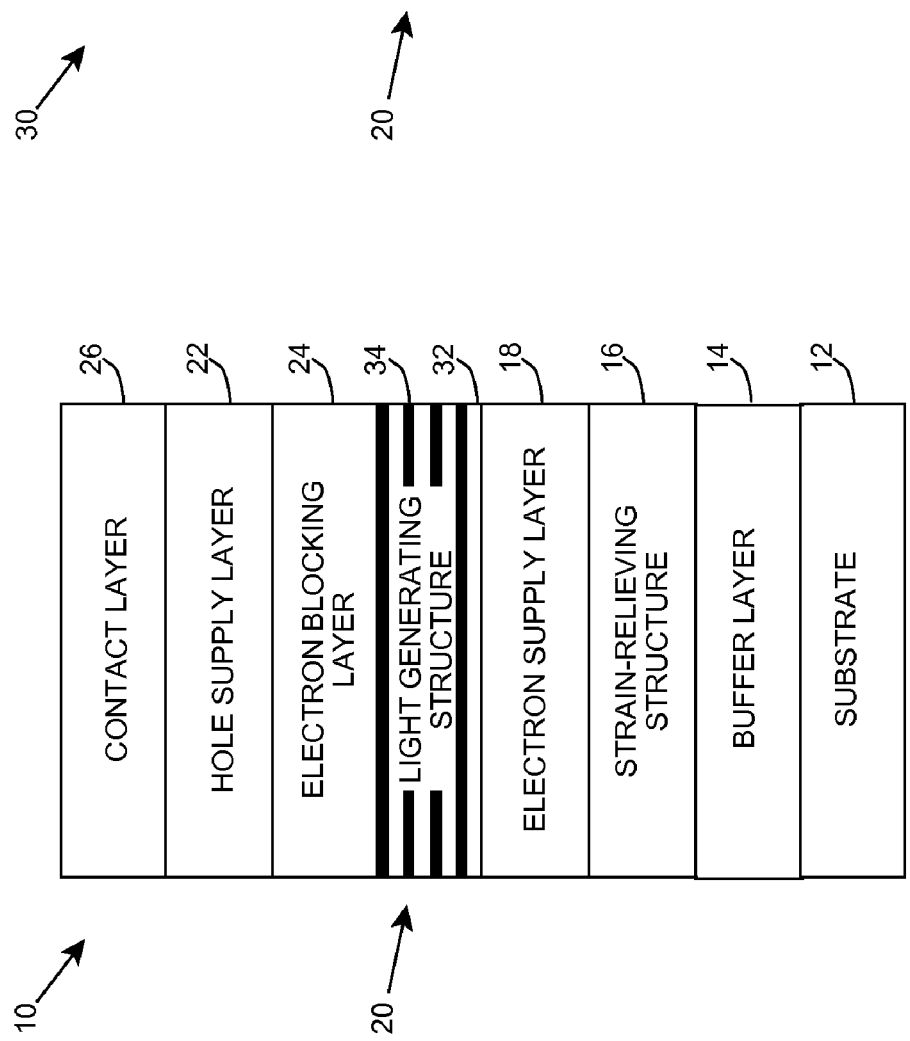
FIG. 1 shows an illustrative nitride-based light emitting heterostructure according to an embodiment of the invention.

Turning to the drawings, FIG. 1 shows an illustrative nitride-based light emitting heterostructure 10 according to an embodiment of the invention. Heterostructure 10 is shown including a substrate 12, a buffer layer 14 on substrate 12, and a strain-relieving structure 16 on buffer layer 14. Heterostructure 10 includes an electron supply layer 18, a hole supply layer 22, and a light generating structure 20 disposed between electron supply layer 18 and hole supply layer 22. Heterostructure 10 also is shown including an electron blocking layer 24 disposed between light generating structure 20 and hole supply layer 22, and a contact layer 26.

Substrate 12 can comprise any type of substrate, such as sapphire, silicon carbide (SiC), silicon (Si), GaN, AlGaN, AlON, LiGaO$_2$, and/or the like. Similarly, buffer layer 14 can comprise any type of buffer layer, such as AlN. Further, strain-relieving structure 16 can comprise any type of strain-relieving structure, such as a superlattice (e.g., a long period superlattice, a short period superlattice, a short or long period superlattice comprising graded composition and/or a variable composition from period to period), multiple quantum wells with wide barriers, a single quantum well, a multi-layered structure (e.g., hundreds of Angstroms thick, no confinement) with abrupt or graded heterointerfaces, and/or the like. Strain-relieving structure 16 can comprise any composition, such as AlN/GaN, AlN/AlGaN, AlGaN/AlGaN, AlInGaN/AlInGaN, or the like. Still further, contact layer 26 can comprise any type of contact layer. In one embodiment, contact layer 26 comprises an ohmic contact as shown and described in co-owned, co-pending U.S. patent application Ser. No. 11/208,679, filed on Aug. 22, 2005 and titled "Ohmic Contact for Nitride-Based Semiconductor Device", which is hereby incorporated herein by reference.

Electron supply layer 18 and hole supply layer 22 also can comprise any type of electron/hole supply layers. For example, electron supply layer 18 can comprise an n-type semiconductor, such as an n-type contact layer or an n-type cladding layer. Similarly, hole supply layer 22 can comprise a p-type semiconductor, such as a p-type contact layer or a p-type cladding layer. Further, hole supply layer 22 could comprise a multi-layer structure, such as a Mg-doped AlGaN/GaN or AlGaInN/AlInGaN short period superlattice. Each supply layer 18, 22 can comprise N with one or more of Ga, Al, or In. In one embodiment, electron supply layer 18 comprises an n-type AlGaN cladding layer, and hole supply layer 22 comprises a p-type Mg-doped AlGaN cladding layer. Alternatively, hole supply layer 22 could be doped with Mn, Be, a Mg co-dopant, such as Mg+O, Mg+Si, and/or the like.

Electron blocking layer 24 can comprise any type of electron blocking layer, such as a p-type AlGaN layer. In one embodiment, electron blocking layer 24 comprises a graded composition that provides a gradual transition from a composition for hole supply layer 22 to a composition for electron blocking layer 24. For example, electron blocking layer 24 can comprise an AlGaN composition having a thickness of approximately 500 Angstroms, in which the Al composition is gradually decreased (e.g., approximately linearly) from approximately sixty percent to five percent. It is understood that this is only illustrative of various alternatives. For example, depending on the growth conditions, the fraction of Al in electron blocking layer 24 can either increase or decrease as electron blocking layer 24 moves closer to light generating structure 20. Further, the content of Al can vary between approximately 100% and approximately 0.1%.

Figure 2:
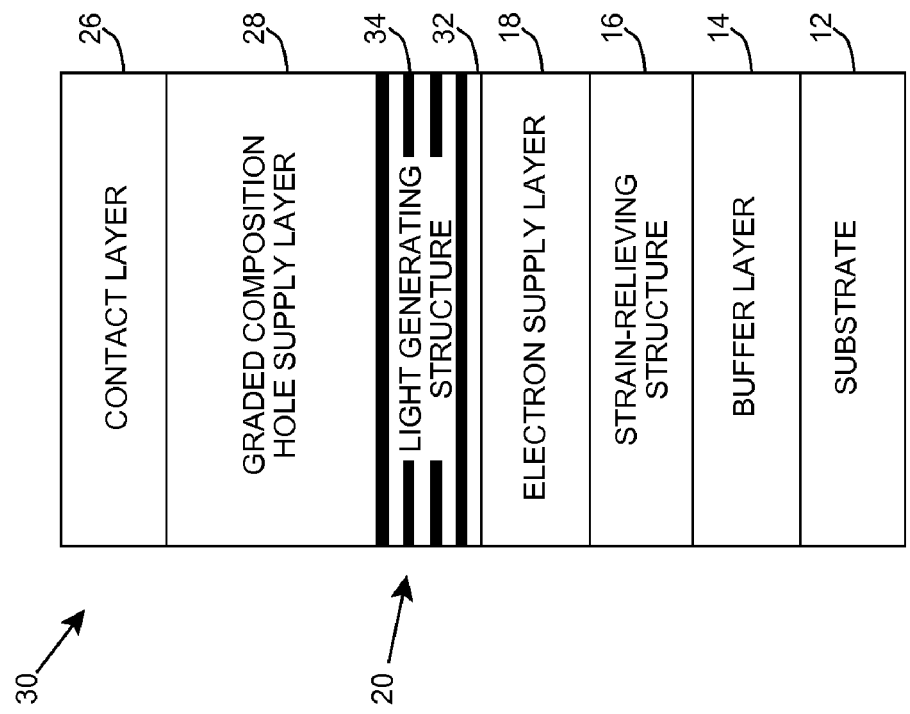
FIG. 2 shows an alternative nitride-based light emitting heterostructure according to an embodiment of the invention.

FIG. 2 shows an alternative nitride-based light emitting heterostructure 30 according to an embodiment of the invention, in which hole supply layer 22 and electron blocking layer 24 of heterostructure 10 of FIG. 1 are replaced with a graded composition hole supply layer 28. Graded composition hole supply layer 28 can comprise a graded composition that transitions from a hole supply layer composition (e.g., a p-type AlGaN or AlGaInN composition) adjacent to contact layer 26 to an electron blocking layer composition (e.g., a p-type AlGaN composition) as layer 28 moves closer to light generating structure 20. In particular, an amount of Al and/or In in layer 28 can be increased/decreased (e.g., approximately linearly) over the width of layer 28. For example, layer 28 can comprise a thickness of approximately 100 nanometers in which an Al composition increases from approximately 0.1% to approximately 70%.

Returning to FIG. 1, light generating structure 20 includes a set of quantum wells 32 and a set of barrier layers 34. In general, the sets of quantum wells 32 and barrier layers 34 can be alternated such that each quantum well 32 is adjoined by at least one barrier layer 34. It is understood that any number of quantum wells 32 and barrier layers 34 can be included in light generating structure 20, including a single quantum well 32 and barrier layer 34. Each quantum well 32 can comprise any composition, such as AlGaN, AlGaInN, and/or the like. In one embodiment, light generating structure 20 comprises a non-uniform clustering of Al in the AlGaN layers. The non-uniform clustering can improve light emission from light generating structure 20 by adding carrier confinement and/or carrier separation from nonradiative centers. In general, non-uniform clustering of Al refers to nano-scale clusters that comprise a different composition than that of the material surrounding the cluster. Such clusters can be incorporated into one or more quantum well(s) 32 and/or barrier layer(s) 34, depending on a desired wavelength of the light generated by light generating structure 20 and/or a design of a device that incorporates heterostructure 10. For example, the surrounding material may comprise a higher Al composition than that of each cluster. In this case, a potential well is generated that can localize non-equilibrium carriers and prevent them from being captured by other nonradiative centers.

Each barrier layer 34 in light generating structure 20 can comprise a graded composition. The graded composition of each barrier layer 34, electron blocking layer 24, and/or graded composition hole supply layer 28 (FIG. 2) causes electrons to lose energy prior to entering a quantum well 32.

In general, a high Al content layer comprises a barrier for electrons and holes. To prevent electron penetration into p-type material, a high Al content layer is used as electron blocking layer 24. However, this will also provide a barrier to holes as they move to the light generating region. In an embodiment of the invention, each barrier layer 34, electron blocking layer 24, and/or graded composition hole supply layer 28 can comprise a ternary or quaternary composition, such as AlGaN, AlGaInN, and/or the like. In one embodiment, each barrier layer 34 comprises ternary or quaternary Al graded composition.

Figure 3B:
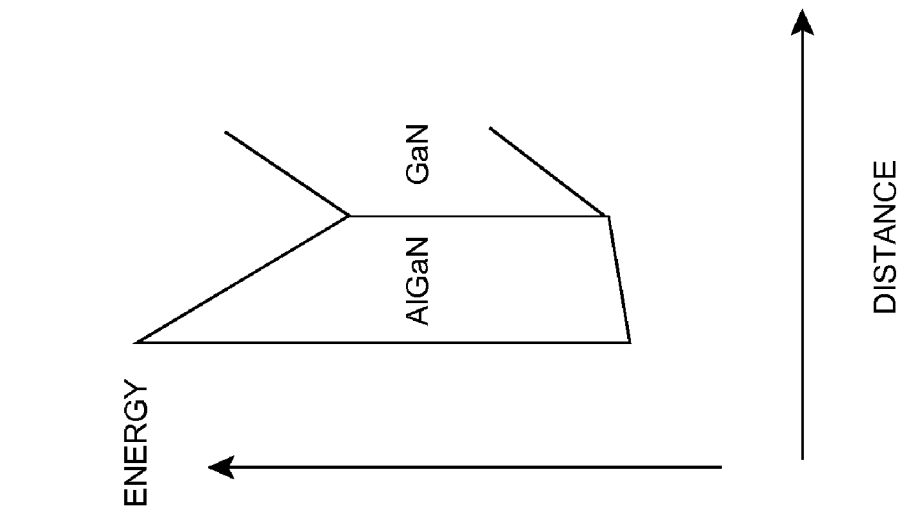
FIGS. 3A-B show illustrative plots of energy versus distance for a barrier layer/quantum well boundary, in which the barrier layer is not graded and graded, respectively.
Figure 3A:
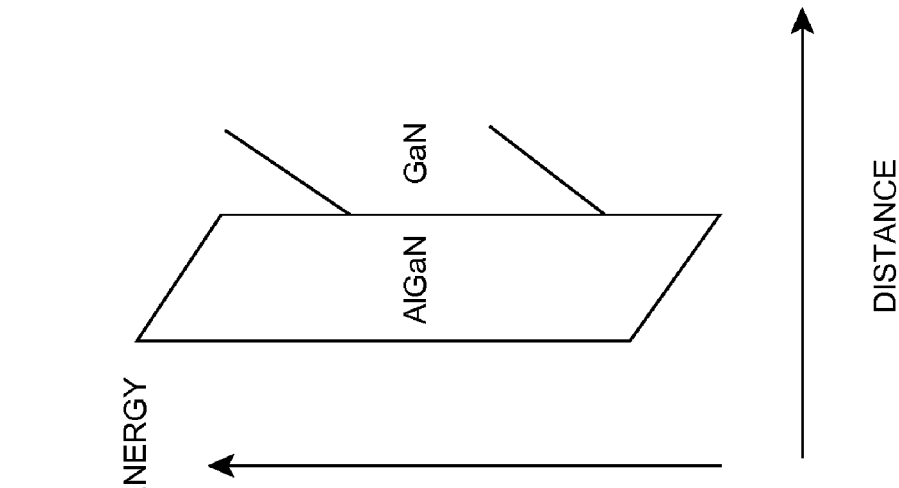

Optimization of graded composition barrier layer 34 can suppress the electron penetration while maintaining good hole injection. For example, FIGS. 3A-B show illustrative plots 36A-B of energy versus distance for an AlGaN barrier layer 34 (FIG. 1)/GaN quantum well 32 (FIG. 1) boundary, in which the AlGaN barrier layer 34 is not graded and graded, respectively. As illustrated in FIG. 3A, the molar fraction of Al in the AlGaN barrier layer 34 is constant, and the boundary includes barriers for both electrons and holes. However, in FIG. 3B, the AlGaN barrier layer 34 has a composition that varies from zero percent Al at the boundary with the GaN quantum well 32 to the same molar fraction of Al as shown in FIG. 3A. In this case, the barrier for electrons increases while the barrier for holes is reduced. This enables the electrons to recombine with holes more efficiently in the quantum well 32.

A thickness (width) of each quantum well 32 in light generating structure 20 can be selected to provide one or more desired operating characteristics. For example, each quantum well 32 can comprise a thickness that is less than a characteristic radius of one or more defects responsible for nonradiative recombination of electrons and holes in quantum well 32. In one embodiment, each quantum well comprises a thickness of approximately two nanometers, which is thinner than the dimension of defects such as dislocation, deep impurity, and/or the like. To this extent, FIG. 4 shows a band diagram 40 of an illustrative quantum well 32, in which a thickness 42 of the quantum well is smaller than a nonradiative recombination center radius 44.

Further, a thickness of each quantum well 32 (FIG. 1) can be selected such that an electron ground state of each quantum well 32 is above a band bending range of energies caused by one or more polarization effects. To this extent, a thickness of each quantum well 32 can generally be in the approximately two to five nanometer range, but in certain cases could be up to approximately ten nanometers. Polarization effects create strong electric fields in quantum well(s) 32. These fields can tilt the band diagram, thereby causing electron-hole separation in real space. For a given polarization field, the thicker the quantum well 32, the larger the band tilt, and the stronger the electron-hole separation. For example, FIGS. 5A-B show illustrative band diagrams 50A-B of a relatively thick quantum well and a relatively thin quantum well, respectively. In FIG. 5A, band diagram 50A illustrates a quantum well in which the electron ground state is within a region of energies affected by a polarization field. In this case, the overlap of the electron and hole wave functions is very small, resulting in a very inefficient light emission. In sharp contrast, FIG. 5B shows a band diagram 50B for a relatively thin quantum well 32, in which the electron ground state is in the region of energies for which the polarization field has little or no effect. In this case, the overlap of the electron and hole wave functions is very large, resulting in a very efficient light emission.

Still further, a thickness of each quantum well 32 (FIG. 1) can be selected to ensure that an electron ground state of each quantum well 32 comprises a higher energy than a highest energy of the bottom of a conduction band in the same quantum well 32. In this case, the electron wavefunction will occupy the entire quantum well, thereby providing a stronger overlap with the hole wavefunction. For example, for a typical polarization field of $F_p=2$ MV/cm (20 meV/nm), the band bending energy is equal to $BB=F_p d$, where d is the thickness of the quantum well. The electron ground state energy can be approximated by:

$$E_O = \frac{\pi^2 \hbar^2}{2 m_e d^2}$$

(it is actually higher due to band bending pushing the ground state up), in which h is the Planck constant, $m_e$ is the electron effective mass (which can be estimated for GaN as $0.228\, m_o$, where $m_o$ is the free electron rest mass). In this case, comparing the band bending and the ground state energy for GaN as a function of d, a width of quantum well 32 should be smaller than approximately 4.5 nanometers to ensure that the electron ground state energy is higher than the band bending energy.

Figure 6:
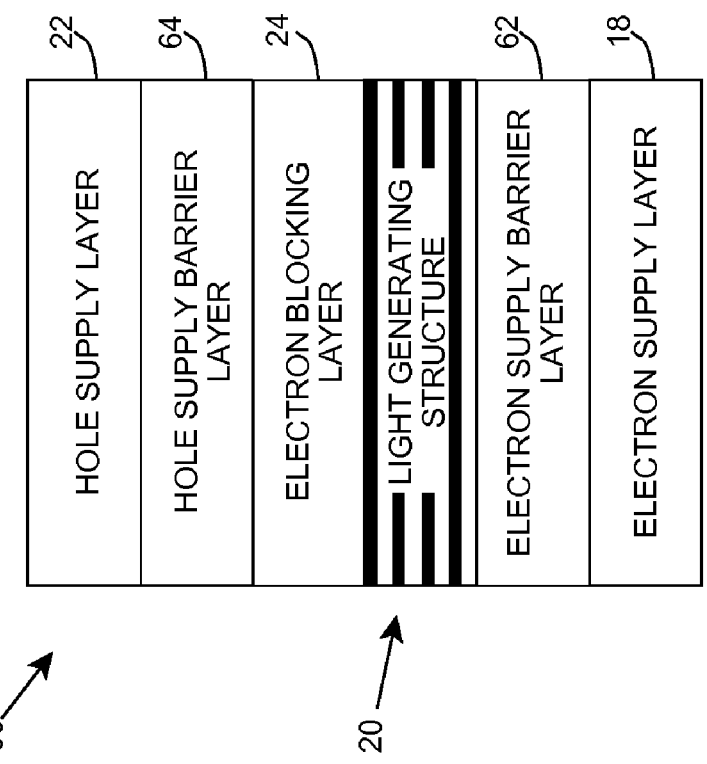
FIG. 6 shows an alternative nitride-based light emitting heterostructure that includes an electron supply barrier layer and a hole supply barrier layer according to an embodiment of the invention.

FIG. 6 shows an alternative nitride-based light emitting heterostructure 60 that includes an electron supply barrier layer 62 and a hole supply barrier layer 64 according to an embodiment of the invention. In heterostructure 60, electron supply barrier layer 62 is adjacent to electron supply layer 18 and comprises a graded composition that creates a band structure profile such that electrons entering light generating structure 20 comprise an energy that is approximately the same as an energy of a polar optical phonon. Similarly, hole supply barrier layer 64 is adjacent to hole supply layer 22 and comprises a graded composition that creates a band structure profile such that holes entering light generating structure 20 comprise an energy that is approximately the same as an energy of a polar optical phonon. In this case, the composition difference between light generating structure 20 and electron blocking layer 24 can be tuned to ensure that the holes only see a potential difference of a polar optical phonon. To this extent, FIG. 8 shows a quantum well (in dashed lines) having an adjacent electron supply barrier layer 62 (FIG. 6), which creates a band structure profile such that electrons entering the quantum well have their energy close to the polar optical phonon energy. Further, FIG. 8 shows an illustrative electron trajectory in energy space and an energy of a polar optical phonon. In a nitride layer, the polar optical phonon energy is approximately 90 meV, depending on the composition of the layer. In this case, an electron can comprise an energy that is within a few meV of 90 meV (e.g., approximately 87-93 meV) when it enters the quantum well.

Figure 7:
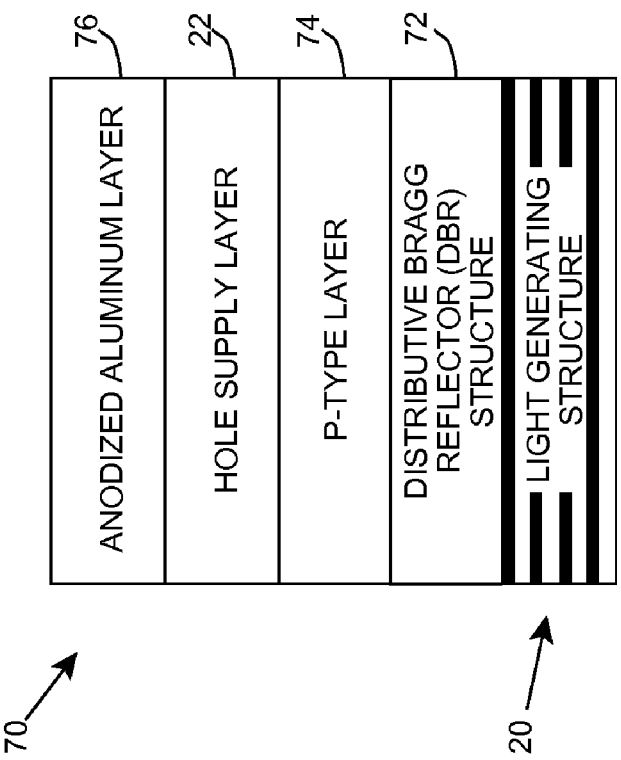
FIG. 7 shows an alternative nitride-based light emitting heterostructure that includes a Distributive Bragg Reflector (DBR) structure and an anodized aluminum layer according to an embodiment of the invention.

FIG. 7 shows an alternative nitride-based light emitting heterostructure 70 that includes a Distributive Bragg Reflector (DBR) structure 72 according to an embodiment of the invention. DBR structure 72 can reflect light of particular wavelength(s), thereby enhancing the output power of heterostructure 70. Further, heterostructure 70 includes a p-type layer 74 over which hole supply layer 22 is disposed. DBR structure 72 and p-type layer 74 each can comprise any composition based on a desired wavelength of the light generated using heterostructure 70. In one embodiment, DBR structure 72 comprises a Mg, Mn, Be, or Mg+Si-doped p-type composition. It is understood that DBR structure 72 could be included in heterostructure 70 without p-type layer 74. Similarly, p-type layer 74 could be included in heterostructure 70 without DBR structure 72. In this case, p-type layer 74 could comprise a p-type AlGaN, AlInGaN. P-type layer 74 could substitute for electron blocking layer 24 (FIG. 1) and/or could be incorporated between hole supply layer 22 and electron blocking layer 24.

Further, heterostructure 70 is shown including an anodized aluminum layer 76 over hole supply layer 22, which can enhance an efficiency with which light is extracted from heterostructure 70. In one embodiment, anodized aluminum layer 76 and hole supply layer 22 comprise a set of holes that form a photonic crystal. Further, hole supply layer 22 can comprise a set of holes, each of which is aligned with a hole in anodized aluminum layer 76. In either case, one or more of the holes can include (e.g., be filled with) a material, such as $SiO_2$, having a different refractive index than a composition of hole supply layer 22.

Returning to FIG. 1, for an electron velocity of approximately $2 \times 10^7$ cm/s and a light generating structure 20 comprising a typical thickness of approximately 500 Angstroms, an electron with an energy less than an optical phonon can "zoom" over light generating structure 20 in less than approximately $3 \times 10^{-13}$ seconds, which is comparable to a typical phonon emission time. In general, light generating structure 20 will include alternating quantum wells 32 and barrier (blocking) layers 34, which act to slow the electrons down. Additionally, electron blocking layer 24 can prevent electrons from leaving light generating structure 20.

To this extent, in another embodiment of the invention, a light emitting heterostructure, such as nitride-based light emitting heterostructure 10, includes light generating structure 20 contained within a potential well that serves to contain electrons, holes, and/or electron and hole pairs within light generating structure 20. In particular, a phonon engineering approach can be used in which the band structure of the potential well and/or light generating structure 20 is designed to facilitate the emission of polar optical phonons. In this case, the potential well can be wider than light generating structure 20 to capture an electron and keep the electron as close to the top of quantum well(s) 32 as possible. In this manner, fewer electrons received from electron supply layer 18 will zoom over quantum wells 32, thereby enabling light generating structure 20 to emit light more efficiently. Additionally, by including light generating structure 20 in a potential well, electron blocking layer 24 and/or barrier layers 34 may not be required since the potential well will capture electrons. For example, the potential well can induce electrons to emit a phonon and cool down. A final state of the electron transitions after emitting a polar optical phonon may include a bottom of the potential well, an electron ground state in quantum well 32, an excited state in quantum well 32, and/or the like.

For example, FIGS. 9A-E show illustrative schematic band structure profiles 80A-E for a potential well 21 containing a light emitting quantum well structure (e.g., alternating barrier layers 34 and quantum wells 32) according to embodiments of the invention. In particular, each schematic band structure profile 80A-E comprises an edge of a conduction band for the composition of each corresponding structure (e.g., Al composition for ternary layers, AlIn composition for quaternary layers, and/or the like). Potential well 21 can be configured so that electrons entering light generating structure 20 (FIG. 1) have an energy that is above an electron subband level 82 (e.g., electron ground state energy) in quantum well(s) 32 and will tend to lose an amount of energy that is resonant with an energy of a polar optical phonon in the device material ($E_{OPT\text{-}PHONON}$), thereby inducing the electron to emit one or more polar optical phonons. For example, the amount of energy can be approximately the same as the energy of a polar optical phonon, approximately an integer multiple (e.g., 2) of the energy of a polar optical phonon, and/or the like.

Several configurations of the relative energies between potential well 21, quantum wells 32, and/or barrier layers 34 can be used to increase an amount of electrons entering light generating structure 20 (FIG. 1) that will emit polar optical phonon(s). For example, in band structure profile 80A of FIG. 9A, a difference between an energy 86 at a top of potential well 21 and an energy 88 at a top of quantum well(s) 32 is equal to or greater than an energy of a polar optical phonon in the device material. In this case, a difference in energy 84A between an electron entering potential well 21 and the top of quantum well(s) 32 may be approximately equal to or greater than the energy of the polar optical phonon in the device material. As a result, such an electron will emit a phonon and cool down upon entering the potential well 21. To this extent, a difference in composition on the p-type side of light generating structure 20 (e.g., between light generating structure 20 and electron blocking layer 24 (FIG. 1)) will act as a barrier for the cold electrons.

Figure 9B:
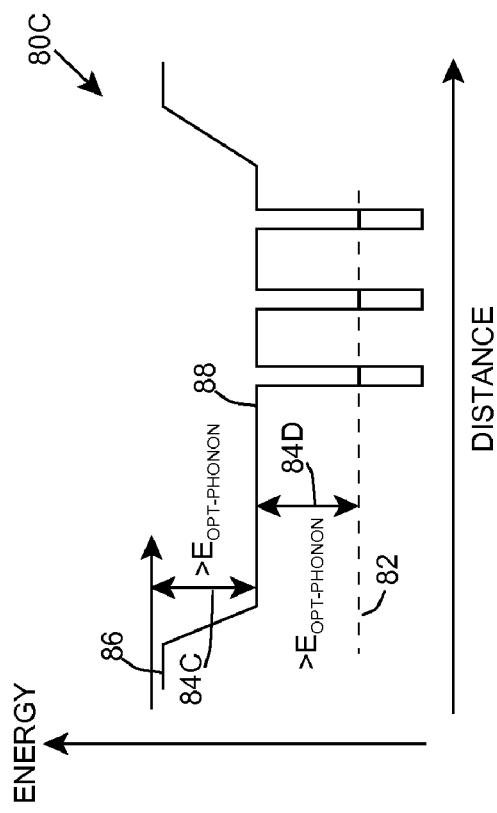

In FIG. 9B, band structure profile 80B illustrates a configuration in which a difference between an energy 86 at a top of potential well 21 (FIG. 9A) and an electron ground state energy 82 of quantum well(s) 32 (FIG. 9A) is equal to or greater than an energy of a polar optical phonon in the device material. In this case, a difference in energy 84B between an electron entering potential well 21 and the electron ground state energy 82 of quantum well(s) 32 will be approximately equal to or greater than the energy of the polar optical phonon in the device material. As a result, an electron will emit a phonon and cool down upon entering a quantum well 32.

Figure 9C:
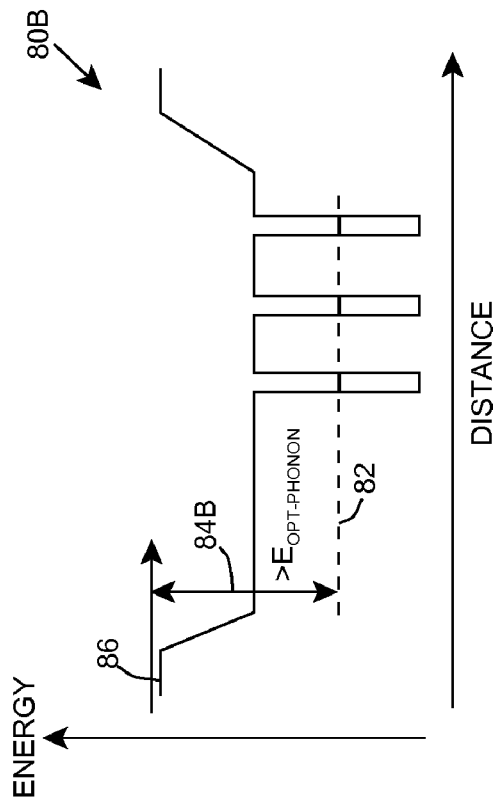

In FIG. 9C, band structure profile 80C illustrates a configuration in which both a difference between an energy 86 at a top of potential well 21 (FIG. 9A) and an energy 88 at a top of quantum well(s) 32 (FIG. 9A) and a difference between energy 88 and an electron ground state energy 82 of quantum well(s) 32 are equal to or greater than an energy of a polar optical phonon in the device material. In this case, an electron entering potential well 21 will comprise an energy that is higher than electron ground state energy 82 by approximately two times the energy of a polar optical phonon in the device material. As a result, an electron will emit two phonons when cooling to electron ground state energy 82.

Returning to FIG. 9A, potential well 21 and/or light generating structure 20 (FIG. 1) can include one or more optimizations to increase electron capture. For example, a width of potential well 21 can be determined based on the electron velocity within potential well 21 and a period of the polar optical phonon energy. To this extent, a distance 90 from an edge of potential well 21 to a first quantum well 32 (e.g., a width of a first barrier layer 34 in light generating structure 20) can be approximately equal to or greater than a ballistic path (e.g., mean free path) of the electron. Distance 90 can be determined based on the electron velocity in potential well 21 and the polar optical phonon energy. In an embodiment of the invention, distance 90 is equal to or larger than a product of the electron velocity in potential well 21 with a phonon emission time. For example, for an electron velocity of approximately $2 \times 10^7$ centimeters/second and a phonon emission time of approximately $1 \times 10^{-13}$ seconds, distance 90 would comprise approximately 200 Angstroms (i.e., $2 \times 10^7 * 1 \times 10^{-13} = 2 \times 10^{-6}$ cm).

Similarly, distance 90 can be determined based on a cooling length of an electron via emitting a polar optical phonon in potential well 21. In this case, distance 90 can comprise a function of a velocity of an electron in the device material and a momentum relaxation time. For example, assuming the following constants: free electron rest mass, $m_0=9.11\times10^{-31}$ kilograms; electron charge, $q=1.602\times10^{-19}$ Coulombs; polar optical energy, $DE=0.092$; effective mass, $m=0.23$; and an electron mobility, $mob=0.02\,m^2/V-s$, then the electron velocity (e.g., an average velocity of electrons having an optical phonon energy above the band edge), v, can be calculated as:

$$v=0.5(2*q*DE/(m*mo))^{1/2};$$

in which the factor of 0.5 accounts for an angular distribution of the injected electrons, and the momentum relaxation time can be calculated as:

$$tau=m*mo*mob/q.$$

In this case, distance 90, L, can be calculated as:

$$L=tau*v.$$

These calculations and constants yield a distance 90 of approximately 4.9 nanometers. Alternatively, using an optical phonon electron mobility, $mob=0.15\,m^2/V-s$ instead of the electron mobility, yields a distance 90 of approximately 36.8 nanometers. To this extent, distance 90 can comprise a distance of at least three nanometers, e.g., within a range from approximately 5 nanometers to approximately 40 nanometers.

Figure 9D:
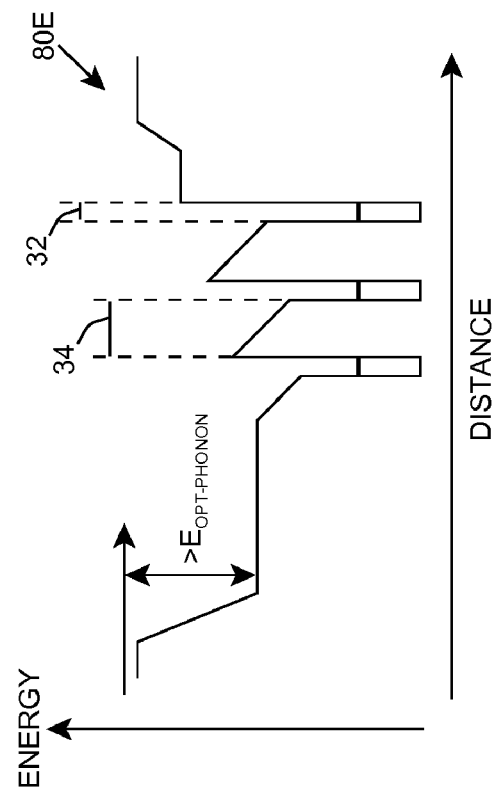
Figure 9E:
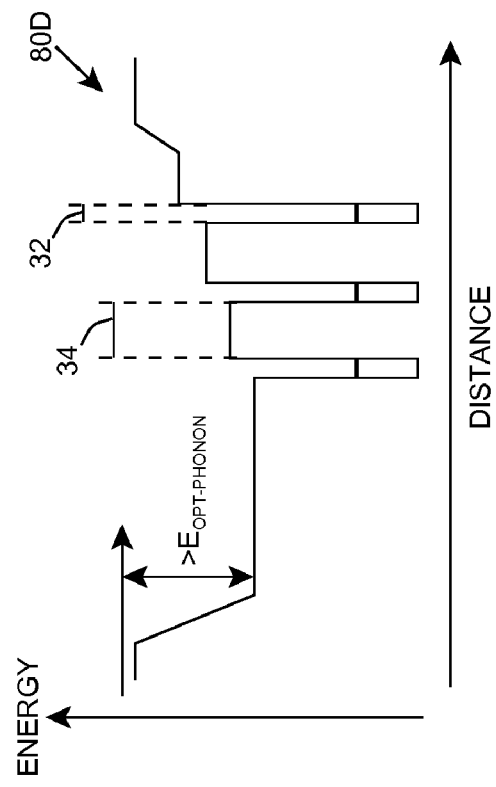

Further, various optimizations of barrier layers 34 (FIG. 9A) can be performed to increase the capture of electrons in quantum wells 32. For example, FIG. 9D shows a band structure profile 80D in which barrier layers 34 and quantum wells 32 (FIG. 9A) comprise a step-like structure. In particular, each successive barrier layer 34 separating the quantum wells 32 comprises an energy that is slightly higher than a preceding barrier layer 34. For example, the difference(s) in energies between successive barrier layers 34 can comprise any fraction of the polar phonon energy, e.g., ten percent, twenty percent, and/or the like. Such a multi-quantum well structure can be manufactured using, for example, different doping profiles (e.g., delta-doping) for each barrier layer 34. Additionally, FIG. 9E shows a band structure profile 80E in which barrier layers 34 comprise a graded energy level (which can be obtained using a graded composition for barrier layer 34), in addition to the step-like structure. Regardless, it is understood that any combination of optimizations can be included in light generating structure 20 (FIG. 1) and/or potential well 21.

It is understood that while band structure profiles 80A-E have been shown and described with respect to electrons and electron energies, band structure profiles 80A-E also can illustrate holes, electron and hole pairs, and/or a valence band structure of a potential well containing a light generating quantum well structure 20 (FIG. 1). In this case, a final state of the hole transitions after emitting a polar optical phonon may include a valence band inside of the hole potential well, a hole ground state energy in quantum well 32, or an excited hole state in quantum well 32. Additionally, while band structure profiles 80A-E can be implemented in the various layers/structures shown and described herein, it is understood that light generating structure 20 (FIG. 1) can comprise any type of material (nitride-based or otherwise) and/or combination of layers.

Further, it is understood that the various heterostructures illustrated and discussed herein are only illustrative of numerous heterostructure configurations that can be implemented under the invention. In particular, under the invention, a heterostructure can include one or more additional layers, one or more fewer layers, and/or the order of layers can be altered based on one or more desired operating characteristics. Further, each layer can be configured to fully or partially cover a lower layer based on the desired operating characteristics and/or device configuration. Additionally, one or more additional device components can be added to heterostructure. To this extent, the invention also provides various types of devices, such as a light emitting device, e.g., a light emitting diode, a laser, and/or the like, which include the heterostructure described herein.

The invention further provides a method of generating each of the heterostructures/devices described herein. In particular, each of the various layers described herein can be formed (e.g., deposited, grown, and/or the like) on an adjacent layer, or an intervening layer, using any solution. For example, referring to FIG. 1, heterostructure 10 can be generated by obtaining substrate 12, forming buffer layer 14 on substrate 12, forming strain-relieving structure 16 on buffer layer 14, forming electron supply layer 18 on strain-relieving structure 16, forming light generating structure 20 on electron supply layer 18 (which can include forming one or more alternating quantum well 32 and barrier layers 34 and/or potential well 21 (FIG. 9A)), forming an electron blocking layer 24 on light generating surface 20, forming hole supply layer 22 on electron blocking layer 24, and forming contact layer 26 on electron blocking layer 26. It is understood that each depositing step can include the use of one or more masks and/or the like. Further, additional processing can be performed to heterostructure (e.g., adding one or more desired components), to generate a device.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A light emitting heterostructure comprising:
    a light generating structure contained within a potential well, the light generating structure including a set of quantum wells, wherein a difference between a first energy at a top of the potential well and a second energy of a quantum well in the set of quantum wells is resonant with an energy of a polar optical phonon in a material of the light generating structure.

2. The light emitting heterostructure of claim 1, wherein the second energy comprises an energy at a top of the quantum well.

3. The light emitting heterostructure of claim 2, wherein a difference between the second energy and an electron ground state energy of the quantum well is resonant with the energy of the polar optical phonon.

4. The light emitting heterostructure of claim 1, wherein the second energy comprises an electron ground state energy of the quantum well.

5. The light emitting heterostructure of claim 1, wherein the light generating structure further includes a set of barrier layers.

6. The light emitting heterostructure of claim 5, wherein at least one barrier layer in the set of barrier layers comprises a higher energy level than at least one other barrier layer in the set of barrier layers.

7. The light emitting heterostructure of claim 5, wherein at least one barrier layer comprises a graded energy level.

8. The light emitting heterostructure of claim 1, wherein a distance from a first edge of the potential well to a first quantum well in the set of quantum wells is approximately equal to or greater than a product of an electron velocity within the material with a phonon emission time.

9. The light emitting heterostructure of claim 1, wherein a distance from a first edge of the potential well to a first quantum well in the set of quantum wells is approximately equal to or greater than a product of an electron velocity within the material with a momentum relaxation time.

10. The light emitting heterostructure of claim 1, further comprising an electron supply layer.

11. The light emitting heterostructure of claim 1, further comprising a hole supply layer.

12. The light emitting heterostructure of claim 11, further comprising an electron blocking layer disposed between the light generating structure and the hole supply layer.

13. The light emitting heterostructure of claim 1, further comprising:
    a substrate;
    a buffer layer on the substrate; and
    a strain-relieving structure over the buffer layer.

14. The light emitting heterostructure of claim 1, further comprising a Distributive Bragg Reflector (DBR) structure disposed over the light generating structure.

15. A light emitting device comprising:
    a substrate;
    an electron supply layer over the substrate; and
    a light generating structure that receives electrons from the electron supply layer and is contained within a potential well, the light generating structure including:
    a set of quantum wells, wherein a difference between a first energy at a top of the potential well and a second energy of a quantum well in the set of quantum wells is resonant with an energy of a polar optical phonon in a material of the light generating structure.

16. The light emitting device of claim 15, wherein the second energy comprises an energy at a top of the quantum well.

17. The light emitting device of claim 16, wherein a difference between the second energy and an electron ground state energy of the quantum well is resonant with the energy of the polar optical phonon.

18. The light emitting device of claim 15, wherein the second energy comprises an electron ground state energy of the quantum well.

19. The light emitting device of claim 15, wherein the light generating structure further includes a set of barrier layers.

20. The light emitting device of claim 15, wherein a distance from a first edge of the potential well to a first quantum well in the set of quantum wells comprises at least three Angstroms.

21. The light emitting device of claim 15, further comprising:
    a buffer layer on the substrate; and
    a strain-relieving structure over the buffer layer, wherein the electron supply layer is over the strain-relieving structure.

22. The light emitting device of claim 15, configured to operate as one of a light emitting diode or a laser.

23. A method of generating a light emitting heterostructure, the method comprising:
    forming a region of the light emitting heterostructure having a potential well; and
    forming a light generating structure within the potential well, the forming the light generating structure including:
    forming a set of quantum wells, wherein a difference between a first energy at a top of the potential well and a second energy of a quantum well in the set of quantum wells is resonant with an energy of a polar optical phonon in a material of the light generating structure.

24. The method of claim 23, wherein the second energy comprises an energy at a top of the quantum well.

25. The method of claim 24, wherein a difference between the second energy and an electron ground state energy of the quantum well is resonant with the energy of the polar optical phonon.

26. The method of claim 23, wherein the second energy comprises an electron ground state energy of the quantum well.

27. The method of claim 23, wherein the forming the light generating structure further includes forming a set of barrier layers.

28. The method of claim 27, wherein the forming a set of barrier layers includes optimizing an energy level of at least one of the set of barrier layers to increase electron capture in the set of quantum wells.

29. The method of claim 23, wherein the forming the light generating structure includes determining a distance from a first edge of the potential well to a first quantum well in the set of quantum wells based on an electron velocity within a material of the light generating structure.

* * * * *

UNITED STATES PATENT AND TRADEMARK OFFICE
CERTIFICATE OF CORRECTION

PATENT NO.      : 7,619,238 B2                         Page 1 of 1
APPLICATION NO. : 11/539754
DATED           : November 17, 2009
INVENTOR(S)     : Gaska et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 419 days.

Signed and Sealed this

Twenty-sixth Day of October, 2010

David J. Kappos
*Director of the United States Patent and Trademark Office*